(12) United States Patent
Cannard et al.

(10) Patent No.: US 8,925,393 B2
(45) Date of Patent: Jan. 6, 2015

(54) DEVICE INTENDED FOR MEASURING PRESSURE FROM A FLEXIBLE, FOLDABLE, AND/OR EXTENDABLE OBJECT MADE OF A TEXTILE MATERIAL AND COMPRISING A MEASUREMENT DEVICE

(75) Inventors: Francis Cannard, Beaune (FR); Nicolas Vuillerme, Francin (FR); Yohann Payan, Allevard (FR); Bruno Diot, Mercurey (FR)

(73) Assignee: Francis Cannard (FR)

( * ) Notice: Subject to any disclaimer, the term of this patent is extended or adjusted under 35 U.S.C. 154(b) by 0 days.

(21) Appl. No.: 13/981,882
(22) PCT Filed: Jan. 24, 2012
(86) PCT No.: PCT/FR2012/050151
§ 371 (c)(1),
(2), (4) Date: Oct. 11, 2013
(87) PCT Pub. No.: WO2012/101374
PCT Pub. Date: Aug. 2, 2012

(65) Prior Publication Data
US 2014/0026678 A1 Jan. 30, 2014

(30) Foreign Application Priority Data
Jan. 25, 2011 (FR) .................................. 11 50589

(51) Int. Cl.
| G01L 5/10 | (2006.01) |
| G01L 1/18 | (2006.01) |
| D04B 1/14 | (2006.01) |
| G01R 3/00 | (2006.01) |
| D04B 21/14 | (2006.01) |

(52) U.S. Cl.
CPC ... *G01L 1/18* (2013.01); *D04B 1/14* (2013.01); *G01R 3/00* (2013.01); *D04B 21/14* (2013.01); *D10B 2401/06* (2013.01); *D01B 2401/16* (2013.01); *D10B 2403/02431* (2013.01)
USPC ...................... 73/862.041; 73/862

(58) Field of Classification Search
USPC .............................. 73/862.041, 862
See application file for complete search history.

(56) References Cited

U.S. PATENT DOCUMENTS 6,155,120 A 12/2000 Taylor
2002/0073785 A1* 6/2002 Prakash et al. ........... 73/862.041
(Continued)

OTHER PUBLICATIONS

International Search Report Application No. PCT/FR2012/050151 Completed: Jun. 14, 2012; Mailing Date: Jun. 27, 2012 3 pages.

(Continued)

*Primary Examiner* — Lisa Caputo
*Assistant Examiner* — Jamel Williams
(74) *Attorney, Agent, or Firm* — St. Onge Steward Johnston & Reens LLC

(57) ABSTRACT

The present invention relates to a device for measuring the pressure and/or the tension exerted at different points of a flexible, foldable and/or extensible textile material capable of being used as a garment, lapel, or the like; said device is remarkable in that it includes, on the one hand, at least one sensor obtained from a single layer (1), formed of an arrangement of at least three types of fibers, piezoresistive fibers forming piezoresistive areas (2), conductive fibers forming electrically-conductive areas (3), and insulating fibers forming electrically-insulating areas (4) and, on the other hand, an electronic circuit (5) capable of measuring the electric resistance variation of the piezoresistive areas submitted to one or several forces.

19 Claims, 2 Drawing Sheets

(56) References Cited

U.S. PATENT DOCUMENTS

2003/0119391 A1* 6/2003 Swallow et al. .................. 442/6
2008/0135310 A1* 6/2008 Pomposo Alonso
 et al. .......................... 178/18.05
2014/0150573 A1* 6/2014 Cannard et al. .......... 73/862.627

OTHER PUBLICATIONS

Huang, et al.; "Parametric Design of Yarn-Based Piezoresistive Sensors for Smart Textiles"; Sensors and Actuators A 148 (2008) pp. 10-15.

* cited by examiner

DEVICE INTENDED FOR MEASURING PRESSURE FROM A FLEXIBLE, FOLDABLE, AND/OR EXTENDABLE OBJECT MADE OF A TEXTILE MATERIAL AND COMPRISING A MEASUREMENT DEVICE

BACKGROUND

The present invention relates to a device of pressure measurement from a flexible or foldable object such as a fabric, for example, which is particularly adapted to a pressure measurement to prevent the occurrence of pressure ulcers in people suffering from chronic diseases, for example, a loss of mobility or of sensitivity.

BACKGROUND OF THE INVENTION

It is well known that measuring the pressure, and more generally the distribution of forces on a determined surface, may be achieved by means of so-called capacitive pressure sensors. Said capacitive pressure sensors comprise one or several capacitive cells which are appropriately arranged on the sensor contact surface. Each capacitive cell comprises a pair of panels obtained in an electrically-conductive material and a layer of insulating or dielectric material positioned between the conductive panels.

The pressure acting on the capacitive sensor cells is measured by measuring the capacitance variation of the capacitive cells caused by the variation of the distance between the conductive panels having a pressure exerted thereon.

This is especially featured in European patent application EP 1211633, which describes a device for measuring the pressure distribution on a surface. Pressure measurement devices comprising so-called resistive pressure sensors are also known.

This is especially featured in U.S. Pat. No. 6,155,120, which describes a method and a device for measuring the pressure of a foot by means of the piezoresistance variation. Said device comprises a rectangular array of piezoresistive force sensors enclosed within a thin polymer envelope which is introduced into a shoe, or which is incorporated to a sock likely to be worn on a foot or on a hoof The preferred embodiment of the invention uses piezoresistive elements for detecting pressures or normal forces, which comprise a polymer fabric mesh impregnated with conductive particles in suspension in an elastomeric vehicle, preferably silicon rubber. The meshed piezoresistive layer is sandwiched between an array of row and column conductor strip laminations, preferably formed of a Nylon® mesh impregnated with printed metal tracks. In a variation of the basic embodiment, each normal force detection element is bordered with pairs of shear force detection elements, arranged laterally and longitudinally, each of the shear force detection elements comprising a pair of adjacent resilient piezoresistive pads which have lateral surfaces in longitudinal contact. Such pads are slidably moveable, and when urged into more or less intimate contact as a response to shear forces directed perpendicularly to their tangent contact plane, the electric resistance between pads varies in a predetermined way as a function of the shear forces.

US patent application 2009/0128168 is also known, which describes multifunctional conductive polymer structures, and more specifically the use of conductive polymers as sensors in distributed detection systems, as sensors and actuators in multifunctional devices, and for multifunctional fabrics comprising such conductive polymers for controlling humidity, breathing, heart rate, blood pressure, skin temperature, weight and motions, in a sensor system integrated to clothing, for example. A fabric comprising conductive polyaniline fibers which may be used both to distribute energy in a resistive heating and to measure the fabric temperature is described as an example of multifunctional fabric sensor. In an alternative embodiment, a fabric comprising polyaniline fibers for forming a pressure sensor is described, the pressure being directly deduced from the resistance variation of the polyaniline fibers.

All these devices comprising capacitive or resistive sensors have the disadvantage of having a low flexibility, which considerably limits their field of application, such devices being insufficiently comfortable to be used in garments, for example. Further, such devices have high manufacturing costs, due to the use of specific means of production, which are incompatible with a large-scale distribution, and the pressure measured by capacitive sensors depends on ambient phenomena such as temperature and/or humidity.

SUMMARY OF THE INVENTION

One of the aims of the invention thus is to overcome these disadvantages by providing a device for measuring the pressure distribution on a flexible or foldable surface such as a fabric, for example, of simple design and low cost, providing a pressure measurement independent from ambient phenomena such as the temperature and/or the humidity present at the fabric surface.

For this purpose, the invention provides a device for measuring the pressure and/or the tension exerted at different points of a flexible, foldable, and/or extensible textile material, capable of being used as a garment, lapel, or the like; said device is remarkable in that it comprises, on the one hand, at least one sensor obtained from a single layer formed of an arrangement of at least three types of fibers, piezoresistive fibers forming piezoresistive areas, conductive fibers forming electrically-conductive areas, and insulating fibers forming electrically-insulating areas, and on the other hand an electronic circuit capable of measuring the electric resistance variation of the piezoresistive areas submitted to one or several forces.

Said layer is formed of at least one piezoresistive area and of at least two conductive areas insulated from each other by insulating areas in contact by pairs with the piezoresistive area, and each of said areas may be formed of one or of several rows of fibers.

Preferably, the device according to the invention is formed of several piezoresistive areas, a common conductive area connecting a cluster of piezoresistive areas to decrease the number of pairs of conductive areas.

Advantageously, the layer formed by the insulating, piezoresistive, and conductive areas is obtained from knitted, woven, nonwoven, or plaited textile fibers.

Further, the piezoresistive material is an intrinsically conducting polymer (ICP) and/or an organic metal, and preferably polyaniline and/or polypyrrole and/or carbon nanotubes.

Moreover, the conductive yarns are silver and/or nickel yarns.

The rows of conductive fibers, of insulating fibers, and of piezoresistive fibers are obtained from rows in the weft direction or rows in the warp direction of the fabric, and the areas may be formed of one or of several fiber rows.

Said electronic circuit comprises means for measuring an electric resistance variation from the scanning of the cluster of sensors, the scanning being obtained from the sequential selection of one of the electrodes forming the pair of conductive areas, the reading of the sensor resistance variation being obtained from an analog-to-digital converter.

Secondarily, the electronic circuit contains a processor performing the pressure analysis and including methods enabling to process applications, and means enabling to send the data measured from the sensors and the result of the processing operations.

Another object of the invention relates to a sensor for measuring a pressure and/or a tension, capable of being connected to an electronic circuit measuring the electric resistance variation when a pressure and/or a tension is exerted on said sensor, the pressure and/or the tension being a function of the resistance variation; said sensor is remarkable in that it is formed of an arrangement of at least three types of fibers forming a single layer, piezoresistive fibers forming piezoresistive areas, conductive fibers forming electrically-conductive areas, and insulating fibers forming electrically-insulating areas and, on the other hand, an electronic circuit capable of measuring the electric resistance variation of the piezoresistive areas submitted to one or several forces.

Said layer is formed of at least one piezoresistive area and of at least two conductive areas insulated from each other by insulating areas in contact by pairs with the piezoresistive area, and each of said areas may be formed of one or of several rows of fibers.

Preferably, the sensor is formed of several piezoresistive areas, a common conductive area connecting a cluster of piezoresistive areas to decrease the number of pairs of conductive areas.

Further, the piezoresistive material is an intrinsically conducting polymer (ICP) and/or an organic metal, and preferably polyaniline and/or polypyrrole and/or carbon nanotubes.

Moreover, said conductive yarns are silver and/or nickel yarns.

A last object of the invention relates to a method for manufacturing at least one sensor for measuring a pressure and/or a tension capable of being connected to an electronic circuit measuring the electric resistance variation when a pressure and/or a tension is exerted on said sensor, the pressure and/or the tension being a function of the resistance variation; said method is remarkable in that it comprises forming on a single layer an arrangement by weaving, knitting, or plaiting of at least three types of fibers, piezoresistive fibers, conductive fibers, and insulating fibers to form a textile area comprising at least one piezoresistive area, at least two electrically-conductive areas, and at least one electrically-insulating area.

It should be observed that the textile structure forms the sensor. Given that there is no external sensor integration, conversely to most prior art devices, the textile structure has no extra thickness. It is thus possible to use this technique to manufacture, for example, socks capable of measuring pressures with no discomfort for the user, and which can be worn permanently.

Further, since the textile structure can be manufactured by means conventional in the textile industry, the manufacturing cost is very low. It is thus possible to manufacture socks on conventional sock making looms.

Finally, due to the textile structure of the device, the latter is advantageously permeable to air.

DETAILED DESCRIPTION

Figure 1:
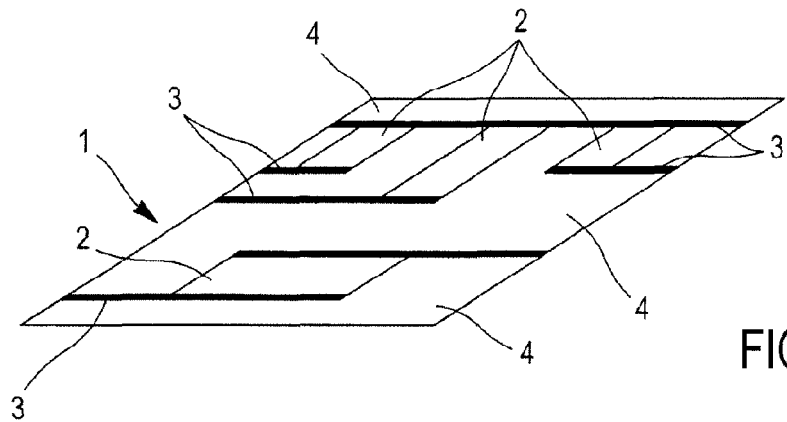
FIG. 1 is a simplified perspective representation of the pressure-measurement device according to the invention.
Figure 2:
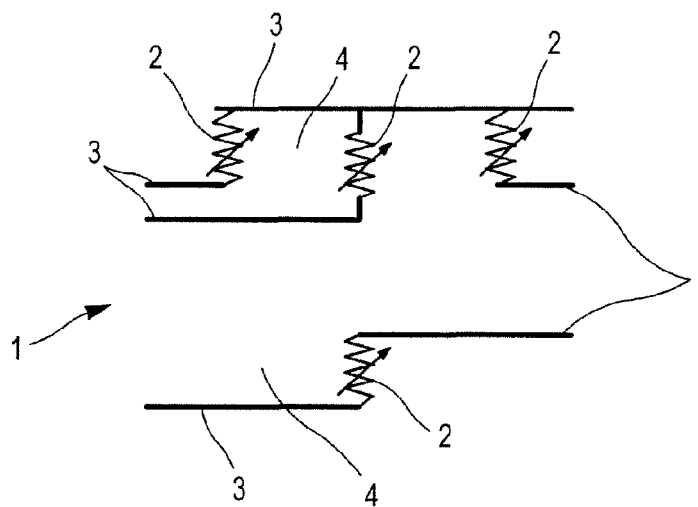
FIG. 2 is a simplified representation of the pressure-measurement device according to the invention.
Figure 3:
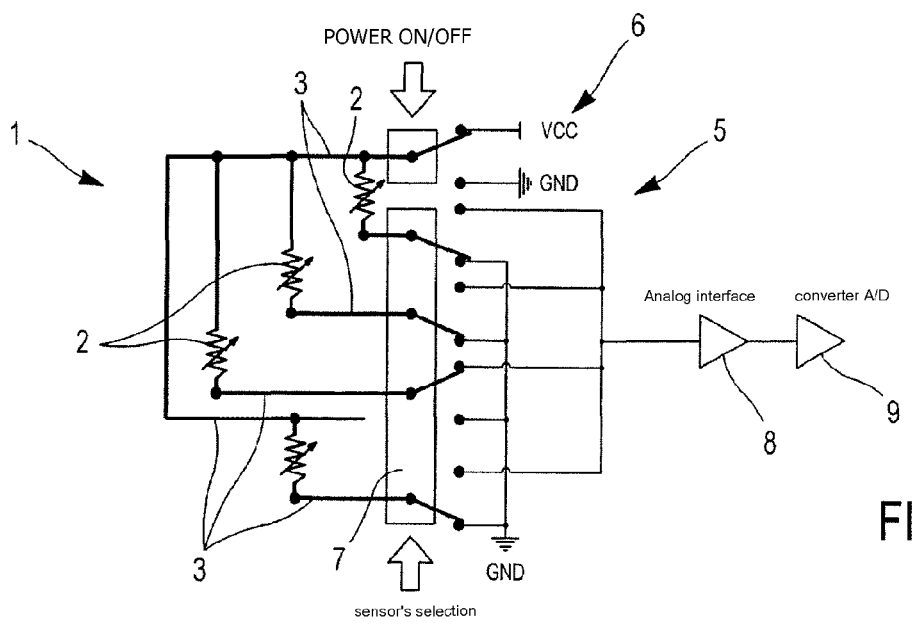
FIG. 3 is a simplified representation of the electronic circuit of the pressure-measurement device according to the invention.

Referring to FIGS. 1 to 3, the device for measuring the pressure and/or the tension exerted on a surface according to the invention is formed of a single layer 1 formed of an arrangement of at least three types of fibers, piezoresistive fibers forming piezoresistive areas 2, conductive fibers forming electrically-conductive areas 3, and insulating fibers forming electrically-insulating areas 4.

In this specific embodiment, the device is formed of several piezoresistive areas 2, a common conductive area 3 connecting a cluster of piezoresistive areas 2, each piezoresistive area forming a sensor, to decrease the number of pairs of conductive areas.

Of course, layer 1 may be formed of any number of piezoresistive areas arranged in any manner on layer 1, the number and the position of said piezoresistive areas depending on the envisaged application and, generally, layer 1 is formed of at least one piezoresistive area 2 and of at least two conductive areas 3 insulated from each other by insulating areas 4 and in contact by pairs with piezoresistive area 2, where each of said areas 2, 3, 4 may be formed of one or several rows of fibers.

Advantageously, layer 1 formed by insulating, piezoresistive, and conductive areas, respectively 4, 2, and 3, is obtained from knit, woven, nonwoven, or plaited textile fibers.

Figure 4:
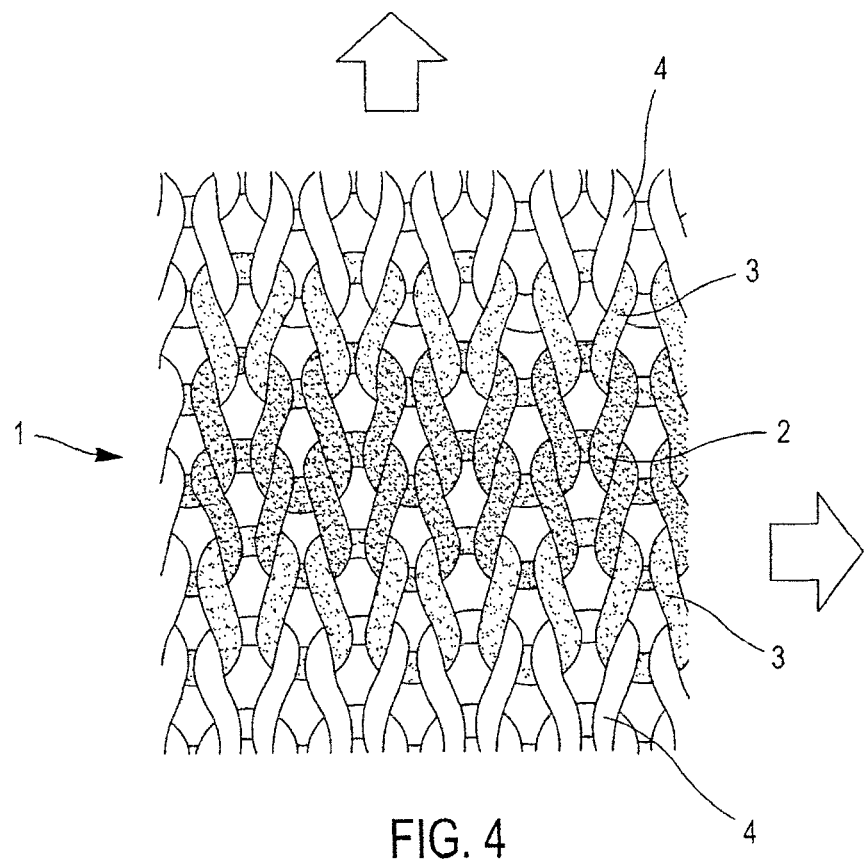
FIG. 4 is a partial top view of the measurement device according to the invention obtained in weft knitting.
Figure 5:
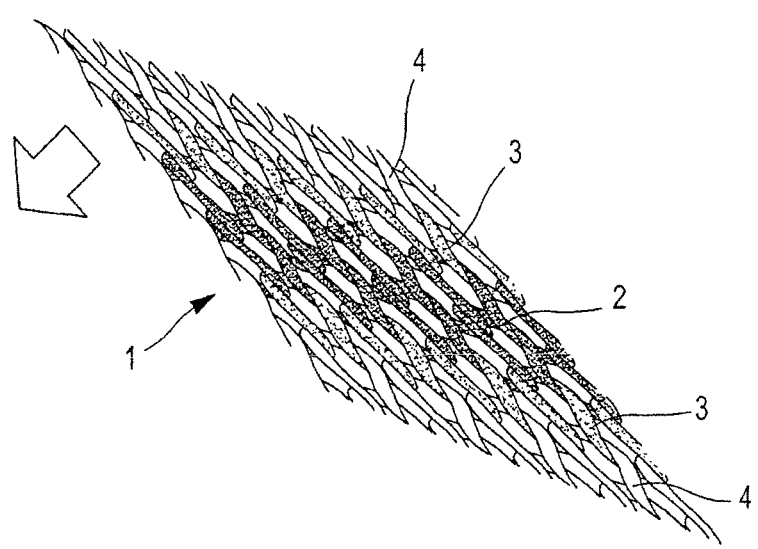
FIG. 5 is a partial perspective view of the measurement device according to the invention obtained in weft knitting, shown in FIG. 4.

Referring to FIGS. 4 and 5, layer 1 is made of piezoresistive, conductive and insulating areas, respectively, 2, 3, and 4, obtained by weft knitting of fibers obtained in a piezoresistive material, of fibers obtained in a conductive material, and respectively of fibers obtained in an insulating material. For example, the piezoresistive material is an intrinsically conducting polymer (ICP) and/or an organic metal, and preferably polyaniline and/or polypyrrole and/or carbon nanotubes. Further, the conductive yarns are silver and/or nickel yarns. Further, the insulating fibers are fibers of cotton, nylon, or any other fiber or material having electrical insulation features, or a mixture of such fibers.

It should be observed that the deformation of the piezoresistive fibers when a tension is exerted on the layer (FIG. 4) or when a pressure is exerted on said layer 1 (FIG. 5) causes an electric resistance variation which may be measured to determine the tension and/or the pressure exerted on layer 1, as will be detailed hereafter.

The rows of conductive fibers, of insulating fibers, and of piezoresistive fibers are obtained from rows in the weft direction or rows in the warp direction of the knitted or weaved fabric, where the areas may be formed of one or of several rows of fibers.

Of course, the different areas 2, 3, and 4 may be obtained by any type of knitting such as a warp knitting, or a weft stitch obtained by any type of weaving or plaiting while remaining within the spirit and scope of the invention.

Further, referring to FIG. 3, the device according to the invention comprises an electronic circuit 5 capable of measuring the electric resistance variation of the piezoresistive areas submitted to one or several forces. Said electronic circuit 5 comprises means for measuring an electric resistance variation from the scanning of the cluster of sensors, that is, of piezoresistive areas 2, the scanning being obtained from the sequential selection of one of the electrodes, that is, of one of the conductive areas 3, forming the pair of conductive areas 3, the reading of the sensor resistance variation being obtained from an analog-to-digital converter.

Thus, conductive yarns of conductive areas 3 in contact with a piezoresistive area 2 are connected to a power supply source 6 and the other conductive yarns 5 are connected to a bus 7 selectively collecting the charges created by the piezoresistive material in piezoresistive areas 2 when a pressure and/or a tension is exerted on at least one of these areas. Said bus 7 is connected to an analog interface 8 connected to an A/D (Analog-to-Digital) converter 9 for the processing of the measured data.

Secondarily, electronic circuit 5 contains a processor, such as the processor of a PC-type computer or the like, not shown in the drawings, performing the pressure analysis and including methods enabling to process applications, and means enabling to send the data measured from the sensors and the result of the processing operations. Said data transmission means may comprise any wire or wireless transmission means such as wi-fi, bluetooth, RFID or the like, well known by those skilled in the art. Due to the simplicity of the electronic assembly, the system may be embarked and operate from an electric power supply source such as a battery or a cell of small size, of lithium cell type, for example.

According to an alternative embodiment, referring to FIGS. 1 to 3, the device according to the invention is formed of at least one fabric area 2 coated with a piezoresistive material, of conductive yarns 3 in contact with said area 1 and an electronic circuit 5 capable of measuring the electric charge created in said area 2 by piezoresistive effect when a pressure is exerted on said area 2, the pressure being proportional to the measured electric charge.

In the rest of the description, term fabric means a flexible resistant surface formed of a regular assembly of interlaced textile yarns, either woven or meshed, or of a synthetic film or an assembly of synthetic films. Further, piezoresistive material means a material capable of providing a resistance variation of said material when the material is submitted to a mechanical stress such as a pressure, for example.

In this specific embodiment, the device according to the invention is formed of an insulating fabric 1, made of cotton, nylon, or any other fiber or material having electric insulation features, or a mixture of such fibers, forming an insulating support and on which a piezoresistive material, preferably an intrinsically conducting polymer (ICP) and/or an organic metal such as polyaniline (PANT) sold by ORMECON™, for example, and/or polypyrrole (PPY), for example, and/or carbon nanotubes, is deposited in several areas 2 of the upper surface of fabric 4. Areas 2 have any geometrical shape, such as a rectangular, square, round shape, etc . . . The number and the position of areas 2 on the upper surface of insulating fabric 1 will especially depend on the envisaged application. It should be observed that areas 2 may also be indifferently positioned on the upper and/or lower surface of the insulating fabric.

Of course, the piezoresistive material may be any piezoresistive material well known by those skilled in the art while remaining within the spirit and scope of the invention.

The piezoresistive material is preferably deposited in areas 2 by a coating method well know by those skilled in the art; however, the piezoresistive material may be deposited in said areas 2 in any other suitable way, such as by projection, for example, while remaining within the spirit and scope of the invention.

As a variation, the piezoresistive material may be a piezoresistive fabric capable of being attached to insulating fabric 1 in any suitable way such as by bonding, stitching or the like.

Further, the device according to the invention comprises conductive yarns 3 connected by pairs to each of said coated areas 2. Conductive yarns 3 are for example silver yarns in contact with two opposite sides of each coated area 2. Conductive yarns 3 may be placed in contact with areas 2 in any suitable way such as by weaving in the fabric weft, by sewing in the fabric, by bonding, etc . . . well known by those skilled in the art.

Referring to FIG. 3, one of conductive yarns 3 in contact with a coated area 2 is connected to a power supply source 6 and the other conductive yarns 3 are connected to a bus 7 selectively collecting the charges created by the piezoresistive material in piezoresistive coated areas 1 when a pressure is exerted on at least one of these areas. Said bus is connected to an analog interface 8 connected to an A/D (Analog-to-Digital) converter 9 for the processing of the measured data.

It should be noted that the device according to the invention will find a large number of applications for sensors capable of taking various shapes. Their flexibility and their comfort enable to specifically use them to measure pressures around the human body. They may for example be used to measure excessive pressures which might cause the occurrence of pressure ulcers, particularly on soft surfaces such as cushions or hospital beds; but also between the body and a scoliosis corset. Given that such sensitive textiles can be easily integrated to clothing, they may equip a pressure-sensitive undergarment or piece of clothing such as socks, for example, which analyze plantar pressures as well as pressures around the foot.

Finally, it should be obvious that the examples which have just been given are specific illustrations only and that they by no means limit the fields of application of the invention.

The invention claimed is:

1. A device for measuring a pressure and/or a tension exerted at different points of a flexible, foldable, and/or extensible material, capable of being used as a garment, lapel, or the like, characterized in that it comprises at least one sensor having a single layer comprising an arrangement of at least three types of fibers, the at least three types of fibers including piezoresistive fibers forming piezoresistive areas, conductive fibers forming electrically-conductive areas, and insulating fibers forming electrically-insulating areas, and an electronic circuit capable of measuring the electric resistance variation of the piezoresistive areas submitted to at least one force.

2. The device of claim 1, characterized in that the layer comprises at least one piezoresistive area and at least two electrically-conductive areas insulated from each other by at least one electrically-insulating area and in contact with the at least one piezoresistive area, and each of said piezoresistive, electrically-conductive and electrically-insulative areas are formed of at least one row of fibers.

3. The device of claim 1, characterized in that the layer comprises a plurality of piezoresistive areas, and a common conductive area connecting the plurality of piezoresistive areas.

4. The device of claim 1, characterized in that the at least three types of fibers comprise knit, woven, nonwoven, or plaited textile fibers.

5. The device of claim 1, characterized in that the piezoresistive fibers comprise an intrinsically conducting polymer and/or an organic metal, and/or carbon nanotubes.

6. The device of claim 5, characterized in that the piezoresistive fibers comprise polyaniline.

7. The device of claim 5, characterized in that the piezoresistive fibers comprise polypyrrole.

8. The device of claim 1, characterized in that the electrically-conductive fibers comprise silver.

9. The device of claim 1, characterized in that the electrically-conductive fibers comprise nickel.

10. The device of claim 1, characterized in that the electrically-conductive fibers, electrically-insulating fibers, and piezoresistive fibers comprise rows that are obtained from rows in a weft direction or rows in a warp direction of the fabric, and the piezoresistive, electrically-conductive, and electrically-insulative areas are formed of at least one row of fibers.

11. The device of any of claim 1, characterized in that the electronic circuit measures an electric resistance variation from the scanning of a plurality of sensors, the scanning being obtained from a sequential selection of an electrode forming a pair of electrically-conductive areas, the reading of the sensor resistance variation being obtained from an analog-to-digital converter.

12. The device of claim 11, characterized in that the electronic circuit contains a processor performing the pressure analysis and processing operations, and a transmitter for transmitting data measured by the sensors and resulting from the processing operations.

13. A sensor for measuring a pressure and/or a tension, capable of being connected to an electronic circuit measuring the electric resistance variation when a pressure and/or a tension is exerted on said sensor, the pressure and/or the tension being a function of the resistance variation, characterized in that it comprises an arrangement of at least three types of fibers forming a single layer, the at least three types of fibers including piezoresistive fibers forming piezoresistive areas, conductive fibers forming electrically-conductive areas, and insulating fibers forming electrically-insulating areas.

14. The sensor of claim 13, characterized in that the layer comprises at least one piezoresistive area and at least two electrically-conductive areas insulated from each other by electrically-insulating areas and in contact with the at least one piezoresistive area, and each of said piezoresistive, electrically-conductive, and electrically-insulative areas are formed of at least one row of fibers.

15. The sensor of claim 13, characterized in that the layer comprises a plurality of piezoresistive areas, and a common conductive area connecting the plurality of piezoresistive areas.

16. The sensor of claim 13, characterized in that the piezoresistive fibers comprise an intrinsically conducting polymer and/or an organic metal, and/or carbon nanotubes.

17. The sensor of claim 16, characterized in that the piezoresistive fibers comprise polyaniline and/or polypyrrole.

18. The sensor of any of claim 13, characterized in that the electrically-conductive fibers comprise silver and/or nickel.

19. A method for manufacturing at least one sensor for measuring a pressure and/or a tension, capable of being connected to an electronic circuit measuring the electric resistance variation when a pressure and/or a tension is exerted on said sensor, the pressure and/or the tension being a function of the resistance variation, characterized in that it comprises forming a single layer comprising an arrangement by weaving, knitting, or plaiting of at least three types of fibers, the at least three types of fibers comprising piezoresistive fibers, conductive fibers, and insulating fibers to form a textile area comprising at least one piezoresistive area, at least two electrically-conductive areas, and at least one electrically-insulating area.

* * * * *